(12) United States Patent
Weidner et al.

(10) Patent No.: US 8,105,092 B2
(45) Date of Patent: Jan. 31, 2012

(54) ELECTRICAL CONNECTOR ASSEMBLY HAVING CONNECTORS MOUNTED TO A CIRCUIT BOARD

(75) Inventors: Kevin E. Weidner, Hummelstown, PA (US); Daron H. Wallace, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 85 days.

(21) Appl. No.: 12/436,393

(22) Filed: May 6, 2009

(65) Prior Publication Data

US 2010/0285675 A1 Nov. 11, 2010

(51) Int. Cl.
*H01R 12/00* (2006.01)
(52) U.S. Cl. .......................................... 439/65; 439/581
(58) Field of Classification Search .................. 439/63, 439/581, 675
See application file for complete search history.

(56) References Cited

U.S. PATENT DOCUMENTS

| | | | | |
|---|---|---|---|---|
| 6,106,304 | A * | 8/2000 | Huang | 439/63 |
| 6,132,244 | A | 10/2000 | Leeman et al. | |
| 6,358,062 | B1 * | 3/2002 | Feldman et al. | 439/63 |
| 6,468,089 | B1 * | 10/2002 | Hubbard et al. | 439/63 |
| 7,234,967 | B2 | 6/2007 | Weidner et al. | |
| 7,445,458 | B1 * | 11/2008 | Yamane | 439/63 |

OTHER PUBLICATIONS

DK Schrum, K Weidner; "Assembly, Jack, 3 Position, Din 1.0/2.3, 75 Ohm"; Tyco Electronics, Harrisburg PA; 1274714-2 Part Number; Jan. 11, 2006; 3 pages.
1274714-2 Product Details; Tyco Electronics, Seriies 1.0/2.3 RF Connectors; Feb. 5, 2009; 1 page.
Series 1.0/2.3 (50 Ohm/75 Ohm); Between Series Adapters; Catalog 1307191, Revised Mar. 2007; pp. 129-151.
Interface Series 1.0/2.3, acc. IEC 169-29 and acc. CECC 22 230; Dr. R. Leeman, dated Jul. 4, 2005; Tyco Electronics Corp., R1-1 (Rev. Feb. 2006) 4 pages.

* cited by examiner

*Primary Examiner* — Tulsidas C Patel
*Assistant Examiner* — Travis Chambers

(57) ABSTRACT

An electrical connector assembly is configured to be mounted to a circuit board having opposite first and second sides that are interconnected by a board edge. The connector assembly includes first and second connectors disposed along the board edge. The connectors are configured to mate with at least one of mating connectors and a circuit board of an external device to electrically couple the first and second connectors with the external device. Each of the first and second connectors has a center signal contact and a shield shell that extends around the center signal contact. The center signal contact of the first connector engages the first side of the circuit board and the center signal contact of the second connector engages the second side of the circuit board. The first and second connectors mate with the at least one of the mating connectors and the circuit board along parallel mating directions.

20 Claims, 4 Drawing Sheets

ELECTRICAL CONNECTOR ASSEMBLY HAVING CONNECTORS MOUNTED TO A CIRCUIT BOARD

BACKGROUND OF THE INVENTION

The subject matter herein relates generally to electrical connectors and, more particularly, to electrical connectors that are mounted to a circuit board.

Some known electrical connectors are mounted to a circuit board. The connectors typically are mounted to a single side of a circuit board, for example. The connectors are arranged to mate with or otherwise engage another connector to electrically couple the connectors with one another. As the sizes of devices that include such circuit boards and connectors decreases, however, the need for more efficient use of the real estate on the circuit boards increases. In order to meet this need, some connectors are arranged in a two by two or larger array that is mounted to one side of the circuit board. But, the array of connectors may protrude a considerable height above the circuit board. Some lower profile devices may be unable to include a circuit board having such an array of connectors. Additionally, some daughter boards having connectors mounted thereto may have insufficient space between the daughter boards and other components to permit use of such a connector array.

With respect to daughter circuit boards that include connectors for mating with backplane circuit boards, the mounting of the connectors to one side of the daughter circuit board causes the center of gravity of the connectors and daughter circuit board to be offset to one side of the daughter circuit board. Hence, the center of gravity may not be located along the daughter circuit board but may be disposed above the side of the board to which the connectors are mounted. As a result, mating the daughter circuit board to the backplane circuit board may be more difficult. For example, an operator may be unable to simply push on an edge of the daughter circuit board to cause the connectors on the daughter circuit board to mate with connectors on the backplane circuit board. The operator will need to use additional caution in applying force to the daughter circuit board to cause the connectors on the daughter circuit board to mate with the backplane circuit board.

Thus, a need exits for connectors mounted to a circuit board that results in a more efficient use of the surface area on the circuit board. Additionally, a need exists for a circuit board with a connector mounted thereto that may be more easily mated with a connector mounted to another circuit board.

BRIEF DESCRIPTION OF THE INVENTION

In one embodiment, an electrical connector assembly is provided. The connector assembly is configured to be mounted to a circuit board having opposite first and second sides that are interconnected by a board edge. The connector assembly includes first and second connectors disposed along the board edge. The connectors are configured to mate with mating connectors of an external device to electrically couple the first and second connectors with the external device. Each of the first and second connectors has a center signal contact and a shield shell that extends around the center signal contact. The center signal contact of the first connector engages the first side of the circuit board and the center signal contact of the second connector engages the second side of the circuit board. The first and second connectors mate with the mating connectors along parallel mating directions.

In another embodiment, another electrical connector assembly is provided. The connector assembly is configured to be mounted to a circuit board proximate to an edge of the circuit board. The connector assembly includes a first coaxial connector and a second coaxial connector. The first coaxial connector has a center signal contact that is disposed within a shield shell. The center signal contact of the first coaxial connector is mounted to a first side of the circuit board. The second coaxial connector has a center signal contact disposed within a shield shell. The center signal contact of the second coaxial connector is mounted to a second side of the circuit board. The first and second coaxial connectors are configured to mate with mating connectors mounted to an external device along mating directions that are oriented parallel to the first and second sides of the circuit board.

DETAILED DESCRIPTION OF THE INVENTION

Figure 1:
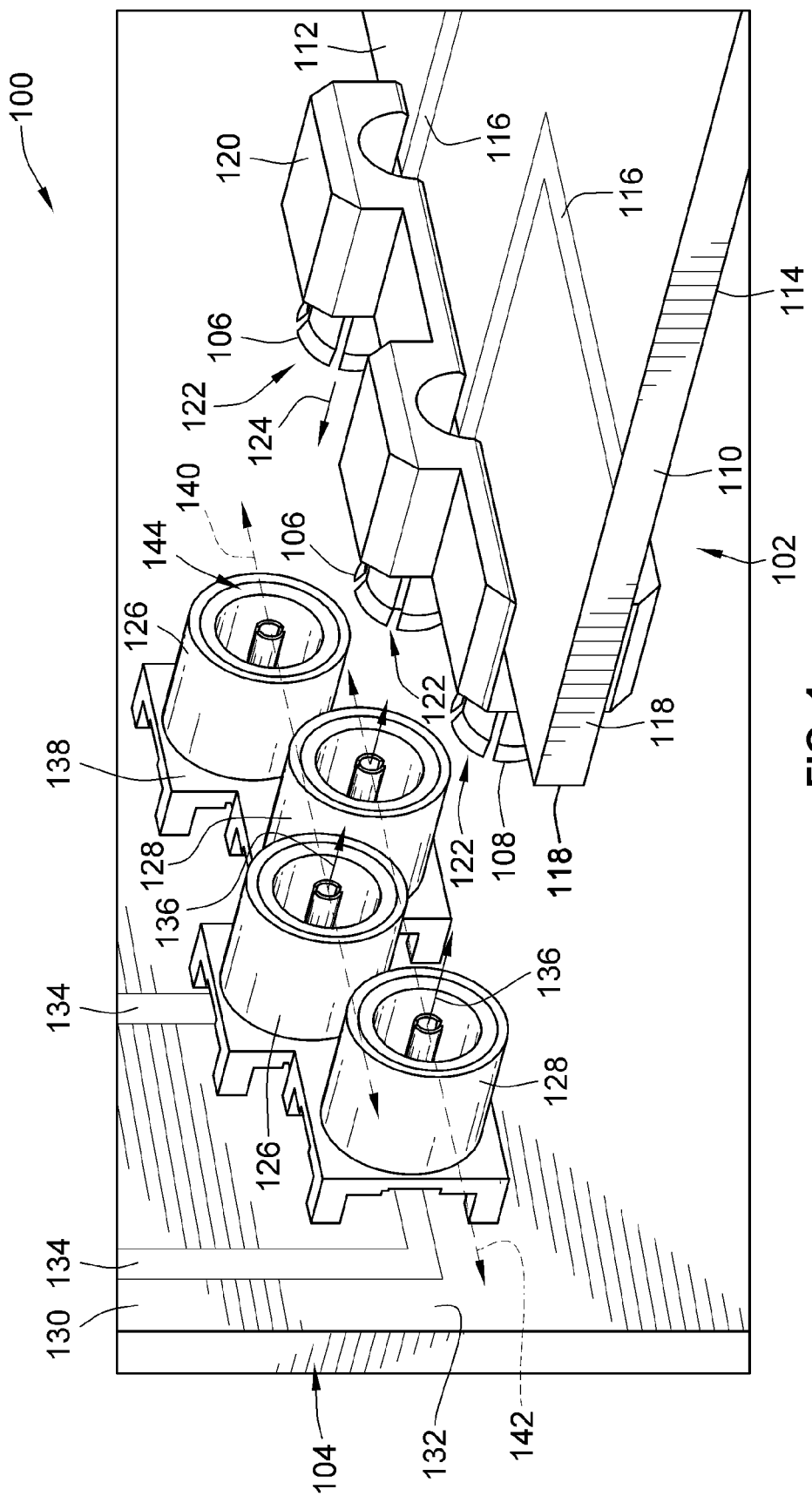
FIG. 1 is a perspective view of an electrical connector system in accordance with one embodiment.

FIG. 1 is a perspective view of an electrical connector system 100 in accordance with one embodiment. The system 100 includes a daughter board connector assembly 102 and a backplane connector assembly 104. The backplane connector assembly 104 alternatively may be referred to as a midplane connector assembly. While the discussion below focuses on daughter boards and backplane or midplane boards and the corresponding connector assemblies, the various embodiments described herein are not necessarily limited to daughter boards and backplane or midplane boards and the corresponding connector assemblies. One or more embodiments described below may be used in conjunction with a different connector system or connector assembly.

The daughter board connector assembly 102 includes several connectors 106, 108 mounted to a daughter board 110. The connectors 106, 108 mounted to the daughter board 110 are the same type of connectors. For example, the connectors 106, 108 may be substantially identical connectors having approximately the same dimensions. The connectors 106, 108 shown in FIG. 1 are coaxial connectors, but may be a different type of connector in an alternative embodiment. The daughter board 110 includes opposite first and second sides 112, 114 that define approximately parallel planes. As shown in FIG. 1, the connectors 106, 108 are mounted to each of the first and second sides 112, 114. The connectors 106 are mounted to the first side 112 while the connectors 108 are mounted to the second side 114.

The first and second sides 112, 114 are interconnected by board edges 118. In the illustrated embodiment, the daughter board 110 is a printed circuit board that includes conductive traces 116 on each of the first and second sides 112, 114. Alternatively, the daughter board 110 may be a different type of circuit board such as a cladding board. The conductive traces 116 optionally may be provided only on a single one of the first and second sides 112, 114. The connectors 106, 108 are electrically coupled with the conductive traces 116. In the illustrated embodiment, the connectors 106 are electrically joined with the conductive traces 116 disposed at or proximate to the first side 112 while the connectors 108 are electrically connected with the conductive traces 116 disposed at or proximate to the second side 114. The conductive traces 116 may provide an electrically conductive path between the connectors 106, 108 and one or more external or peripheral devices (not shown) connected with the conductive traces 116.

The backplane board connector assembly 104 includes several connectors 126, 128 mounted to a backplane board 130. The connectors 126, 128 mounted to the backplane board 130 may be the same type of connectors and are configured to mate with the connectors 106, 108 mounted to the daughter board 110. For example, the connectors 126, 128 may be substantially identical connectors having approximately the same dimensions. The connectors 126, 128 are coaxial connectors, but may be a different type of connector in an alternative embodiment. The backplane board 130 includes a mounting side 132 to which the connectors 126, 128 are mounted. In the illustrated embodiment, the backplane board 130 is a printed circuit board that includes conductive traces 134 similar to the conductive traces 116 of the daughter board 110. Alternatively, the backplane board 130 is a different type of circuit board such as a cladding board. The connectors 126, 128 are electrically coupled with the conductive traces 134. The conductive traces 134 may provide an electrically conductive path between the connectors 126, 128 and one or more external or peripheral devices (not shown) connected with the conductive traces 134.

Each of the connectors 126, 128 is mounted to the backplane board 130 such that the connectors 126, 128 protrude from the mounting side 132 in parallel mating directions 136. The mating directions 136 are oriented perpendicular to the mounting side 132 of the backplane board 130. For example, the connectors 126, 128 in the illustrated embodiment are elongated and oriented along directions that are parallel to one another and perpendicular to the mounting side 132. Alternatively, the mating directions 136 may be oriented parallel to the mounting side 132 of the backplane board 130. For example, in one embodiment, both the connectors 126, 128 and the connectors 106, 108 may be mounted along edges of different circuit boards and configured to mate the circuit boards in an edge-to-edge manner.

The connectors 126, 128 are held within a single, unitary housing 138 in the illustrated embodiment. The housing 138 may include, or be formed from, a molded dielectric material such as a polymer. Alternatively, the housing 138 may include, or be formed from, a conductive material such as metal. The connectors 126, 128 are divided into first and second sets based on how the connectors 126, 128 are aligned. The first set includes the connectors 126 that are linearly aligned laterally with one another along a lateral primary alignment axis 140. The second set includes the connectors 128 that are linearly aligned laterally with one another along a lateral secondary alignment axis 142. The primary and secondary alignment axes 140, 142 are approximately parallel to one another and to the mounting side 132 of the backplane board 130 in the illustrated embodiment. The primary and secondary alignment axes 140, 142 may be disposed in a common plane with one another that is oriented approximately parallel with the mounting side 132 of the backplane board 130.

The daughter board connector assembly 102 and the backplane board connector assembly 104 mate with one another to electrically couple the assemblies 102, 104 with each other. In one embodiment, the daughter board connector assembly 102 and the backplane board connector assembly 104 engage each other in a perpendicular relationship. For example, the daughter board 110 is oriented approximately perpendicular to the backplane board 130 when the daughter board connector assembly 102 and backplane board connector assembly 104 are fully mated. The connectors 106, 108 of the daughter board connector assembly 102 mate with the connectors 126, 128 of the backplane board connector assembly 104 to electrically join the assemblies 102, 104 with each other. Alternatively, the connectors 106, 108 and/or the connectors 126, 128 may be shaped and/or arranged to permit the daughter board connector assembly 102 and the backplane board connector assembly 104 to mate with one another in a non-perpendicular relationship. For example, the connectors 126, 128 may be arranged on the backplane board 130 such that the daughter board 110 and the backplane board 130 are approximately parallel with one another when the daughter board connector assembly 102 and the backplane board connector assembly 104 mate with one another.

The connectors 106, 108 are held within a single, unitary housing 120 in the illustrated embodiment. The housing 120 may include, or be formed from, a molded dielectric material such as a polymer. Alternatively, the housing 120 may include, or be formed from, a conductive material such as metal. The connectors 106, 108 may be integrally formed with the housing 120. For example, the connectors 106, 108 may be assembled into the housing 120 such that the connectors 106, 108 are inseparable from the housing 120. For example, signal contacts 304 (shown in FIG. 3) of the connectors 106, 108 may be laced through the housing 120. Alternatively, the connectors 106, 108 and housing 120 may be separately formed and assembled, with the housing 120 populated with the connectors 106, 108 after the connectors 106, 108 and housing 120 are separately assembled.

The connectors 106, 108 and housing 120 are mounted to the daughter board 110 along a common board edge 118. The connectors 106, 108 and housing 120 may be positioned relative to the board edge 118 so that the center of gravity of the connectors 106, 108 and/or the housing 120 is not located outside of the daughter board 110. For example, the center of gravity of the connectors 106, 108 and housing 120 may be disposed above or within the daughter board 110 and not located beyond the board edge 118. Locating the center of gravity of the connectors 106, 108 and housing 120 over or within the daughter board 110 may prevent inadvertent removal of the connectors 106, 108 and/or housing 120 from the daughter board 110 during assembly of the system 100. For example, during manufacture of the system 100, locating the center of gravity above or within the daughter board 110 and behind the board edge 118 may prevent the connectors 106, 108 from slipping off the daughter board 110 before the connectors 106, 108 are soldered or otherwise secured to the daughter board 110.

As shown in FIG. 1, the connectors 106, 108 protrude past the common board edge 118. Protruding beyond the board edge 118 facilitates mating of the connectors 106, 108 with connectors 126, 128 of the backplane board connector assembly 104. For example, the connectors 106, 108 of the daughter board connector assembly 102 each include a mating interface 122. Similarly, the connectors 126, 128 of the backplane board connector assembly 104 each include a mating interface 144. The mating interfaces 122 of the connectors 106, 108 are positioned to engage the mating interfaces 144 of the connectors 126, 128. For example, the connectors 106, 108 may be spaced apart from one another and the connectors 126, 128 may be spaced apart from one another such that the mating interfaces 122 align with the mating interfaces 144 in order to permit the connectors 106, 108 to mate with the connectors 126, 128. In the illustrated embodiment, the connectors 126, 128 are linearly aligned with the respective primary and secondary alignment axes 140, 142 due to the mating interfaces 144 of the connectors 126, 128 being centered on the primary or secondary alignment axis 140, 142. For example, the connectors 126 are linearly aligned with one another along the primary alignment axis 140 because the mating interfaces 144 of the connectors 126 are approximately centered on the primary alignment axis 140. The connectors 128 may be linearly aligned with one another along the secondary alignment axis 142 because the mating interfaces 144 of the connectors 128 are approximately centered on the secondary alignment axis 142.

The connectors 106, 108 mate with the connectors 126, 128 along parallel mating directions 124. The mating interfaces 122 of the connectors 106, 108 are oriented in a common direction. The connectors 106, 108 are aligned along parallel directions such that the mating interfaces 122 are approximately perpendicular to the mating directions 124. In the embodiment shown in FIG. 1, the board edge 118 along which the connectors 106, 108 are mounted also faces the mating directions 124. For example, the board edge 118 extends approximately perpendicular to the mating directions 124. The mating directions 124 are parallel to planes defined by the first and second sides 112, 114 of the daughter board 110 in the illustrated embodiment. Also as shown in FIG. 1, the mating directions 124 of the connectors 106, 108 oppose the mating directions 136 of the connectors 126, 128. The mating directions 124 extend from the mating interfaces 122 of the connectors 106, 108 and toward the mating interfaces 144 of the connectors 126, 128, while the mating directions 136 extend from the mating interfaces 144 of the connectors 126, 128 and toward the mating interfaces 122 of the connectors 106, 108. The mating directions 124 of the connectors 106, 108 are oriented perpendicular to the mounting side 132 of the backplane board 130. The mating directions 136 of the connectors 126, 128 are oriented parallel to the sides 112, 114 of the daughter board 110.

Figure 2:
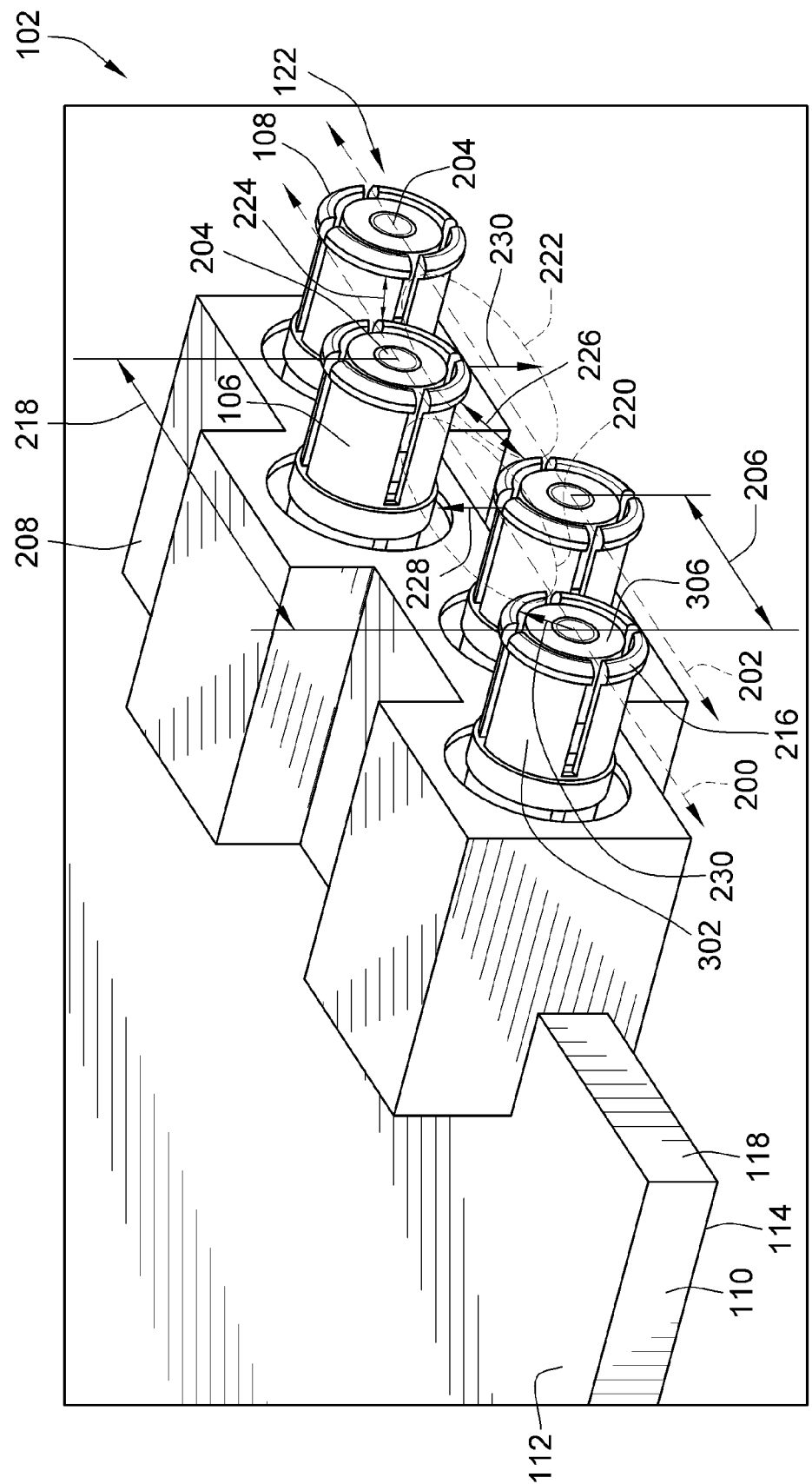
FIG. 2 is a perspective view of a daughter board connector assembly shown in FIG. 1.

FIG. 2 is a perspective view of the daughter board connector assembly 102. In the illustrated embodiment, the connectors 106, 108 include an outer shield shell 302. The shield shell 302 includes an outer rim 216 that defines the shape of the mating interfaces 124. For example, the outer rims 216 shown in FIG. 2 have an approximately circular shape to define approximately circular mating interfaces 122. A center point 204 of each mating interface 122 represents the center of the circles defined by the shield shell 302. As shown in FIG. 2, the shield shell 302 is disposed an approximately equal radial dimension 230 from the center point 204 within the mating interface 122 of each connector 106, 108. In another embodiment, the shield shells 302 and/or mating interfaces 122 may have a different shape. A dielectric body 306 is held within the shield shell 302 and is shaped similar to a cylinder. A center signal contact 304 (shown in FIG. 3) may be held in the dielectric body 306, as described below.

The connectors 106 are linearly aligned laterally with one another along a first alignment axis 200 and the connectors 108 are linearly aligned laterally with one another along a second alignment axis 202. For example, the center points 204 of the connectors 106 are laterally disposed along the first alignment axis 200 such that the center points 204 are linearly aligned with one another. Similarly, the center points 204 of the connectors 108 are laterally disposed along the second alignment axis 202 such that the center points 204 are linearly aligned with one another. In the illustrated embodiment, the first and second alignment axes 200, 202 extend approximately parallel to one another. The first and second alignment axes 200, 202 may be disposed in a common plane with one another that is oriented approximately perpendicular with the sides 112, 114 of the daughter board 110.

The center points 204 of the connectors 106 are separated from one another along the first alignment axis 200 by an intra-row spacing dimension 218. Similarly, the center points 204 of the connectors 108 may be separated from one another along the second alignment axis 202 by the same intra-row spacing dimension 218 as the center points 204 of the connectors 106. Alternatively, the intra-row spacing dimension 218 of the connectors 106 may differ from the intra-row spacing dimension 218 of the connectors 108. The gap or open space between the connectors 106 along the first alignment axis 200 may be referred to as a first separation gap 220. Similarly, the gap or open space between the connectors 108 along the second alignment axis 202 may be referred to as a second separation gap 222.

The connectors 106, 108 are separated from one another by angled dimensions 224, 226. The angled dimensions 224, 226 are measured in directions disposed at an angle with respect to each of the first and second alignment axes 200, 202. For example, the angled dimensions 224, 226 may be disposed at non-perpendicular and non-parallel angles with respect to the first and second alignment axes 200, 202. As shown in FIG. 2, the angled dimensions 224, 226 are angled with respect to one another. The angled dimensions 224, 226 may represent the minimum distances between one of the connectors 106 and the two closest connectors 108. Similarly, the angled dimensions 224, 226 may represent the minimum distances between one of the connectors 108 and the two closest connectors 106.

The center points 204 of the connectors 106 are laterally offset from the centers 204 of the connectors 108 in a direction along the first alignment axis 200 or the second alignment axis 202 by an inter-row separation dimension 206. In the illustrated embodiment, the inter-row separation dimension 206 is smaller than the intra-row separation distance 218 between adjacent or neighboring ones of the connectors 106 or the connectors 108 along the corresponding alignment axis 200, 202. The mating interfaces 122 and/or the centers 204 of the connectors 106 are vertically aligned with the second separation gap 222 that extends between neighboring ones of the connectors 108. Similarly, the mating interfaces 122 and/or the centers 204 of the connectors 108 are vertically aligned with the first separation gap 220 that extends between neighboring ones of the connectors 106. For example, the mating interface 122 and/or center 204 of each connector 106 may be aligned with the second separation gap 222 between adjacent connectors 108 in a vertical direction 228 that is disposed perpendicular to the first and second alignment axes 200, 202. Similarly, the mating interface 122 and/or center 204 of each connector 108 may be aligned with the first separation gap 220 between adjacent connectors 106 in a vertical direction 230 that is disposed perpendicular to the first and second alignment axes 200, 202.

Vertically aligning the connectors 106 with the second separation gap 222 and vertically aligning the connectors 108 with the first separation gap 220 arranges the connectors 106, 108 in a staggered, offset layout. For example, the connectors 106, 108 are not vertically aligned with one another along either vertical direction 228, 230. Instead, the connectors 106 are vertically aligned with the open spaces between adjacent ones of the connectors 108, and the connectors 108 are vertically aligned with the open spaces between adjacent ones of the connectors 106. Staggering the connectors 106, 108 with respect to one another may reduce the space used to mount the connectors 106, 108. For example, the inter-row separation dimension 206 may be reduced by mounting the connectors 106, 108 on opposite sides 112, 114 of the daughter board 110 and by offsetting or staggering the connectors 106, 108 with respect to one another. Reducing the inter-row separation dimension 206 can increase the surface mount density of the daughter board connector assembly 102. For example, reducing the inter-row separation dimension 206 may permit the number of connectors 106, 108 mounted to the sides 112, 114 of the daughter board 110 in a given area of one or both sides 112, 114 to be increased.

The connectors 106, 108 are held within a single, unitary housing 208 in the illustrated embodiment. As shown in FIG. 2, the housing 208 may be continuous through the connectors 106, 108. For example, the housing 208 subdivided into discrete sections. The housing 208 may include or be formed from a molded dielectric material such as a polymer. Alternatively, the housing 208 may include or be formed from a conductive material such as a metal. The housing 208 and connectors 106, 108 have a center of gravity that is aligned with the daughter board 110. For example, the center of gravity of the housing 208 and connectors 106, 108 may be located between planes extending along the sides 112, 114. Aligning the center of gravity of the housing 208 and the connectors 106, 108 with the daughter board 110 may provide for easier mating of the daughter board connector assembly 102 with the backplane board connector assembly 104 (shown in FIG. 1). For example, an operator may more easily push the daughter board 110 toward the backplane board 130 to mate the connectors 106, 108 with the connectors 126, 128 (shown in FIG. 1) that are mounted to the backplane board 130. The operator may not need to apply a force to the daughter board 110 that compensates for a center of gravity that is offset toward one of the sides 112, 114 of the daughter board 110.

Figure 3:
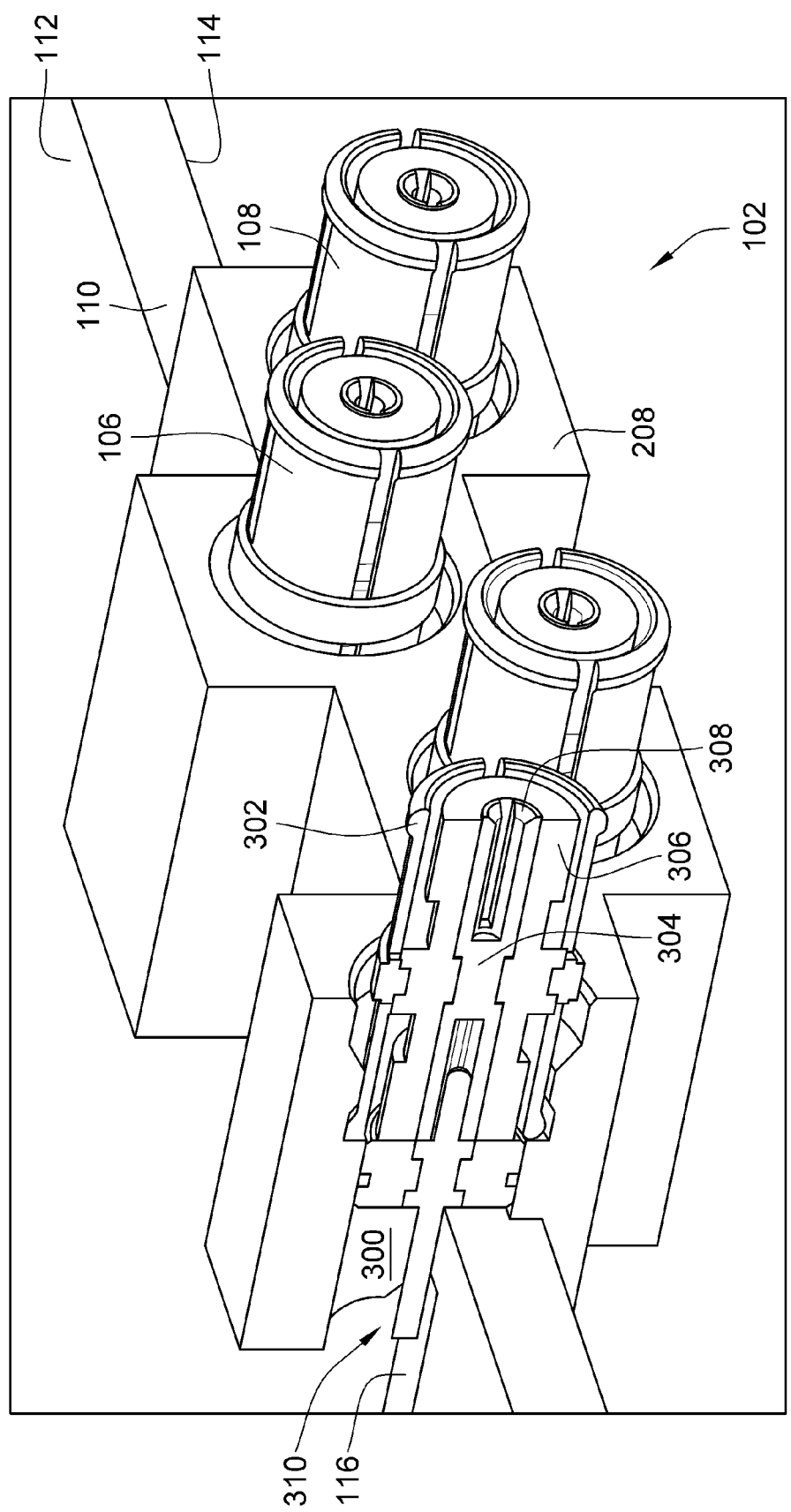
FIG. 3 is a partial cut-away view of the daughter board connector assembly shown in FIG. 1.

FIG. 3 is a partial cut-away view of the daughter board connector assembly 102. As shown in FIG. 3, part of the housing 208 and one of the connectors 106 is removed to illustrate one manner in which the connectors 106, 108 may be mounted to the daughter board 110. While FIG. 3 illustrates the mounting of the connectors 106 with the first side 112 of the daughter board 110, the connectors 108 may be mounted to the second side 114 of the daughter board 110 in a similar manner. The housing 208 includes interior chambers 300 in which the connectors 106, 108 are held. The connectors 106, 108 include the outer shield shell 302 with a center signal contact 304 held within the shield shell 302. The center signal contact 304 includes or is formed from a conductive material and conducts data signals and/or electric power through the connector 106, 108.

A mating end 308 of the center signal contact 304 engages a corresponding conductor or contact (not shown) in a mating connector such as the connector 126 or 128 (shown in FIG. 1). A mounting end 310 of the center signal contact 304 is mounted to one of the sides 112, 114 of the daughter board 110. In one embodiment, the mounting end 310 is electrically coupled with one or more conductive traces 116 to electrically couple the connector 106, 108 with the conductive traces 116. The shield shell 302 includes or is formed from a conductive material. The shield shell 302 shields the center signal contact 304 from electromagnetic interference. The shield shell 302 may be electrically coupled with one or more conductive traces 116 of the daughter board 110 to electrically join the shield shell 302 with an electric ground reference. The center signal contact 304 is electrically isolated from the shield shell 302 by the dielectric body 306. The dielectric body 306 may be a sleeve that extends around the center signal contact 304 and between the center signal contact 304 and the shield shell 302. The dielectric body 306 includes or is formed from a dielectric material such as a polymer.

Figure 4:
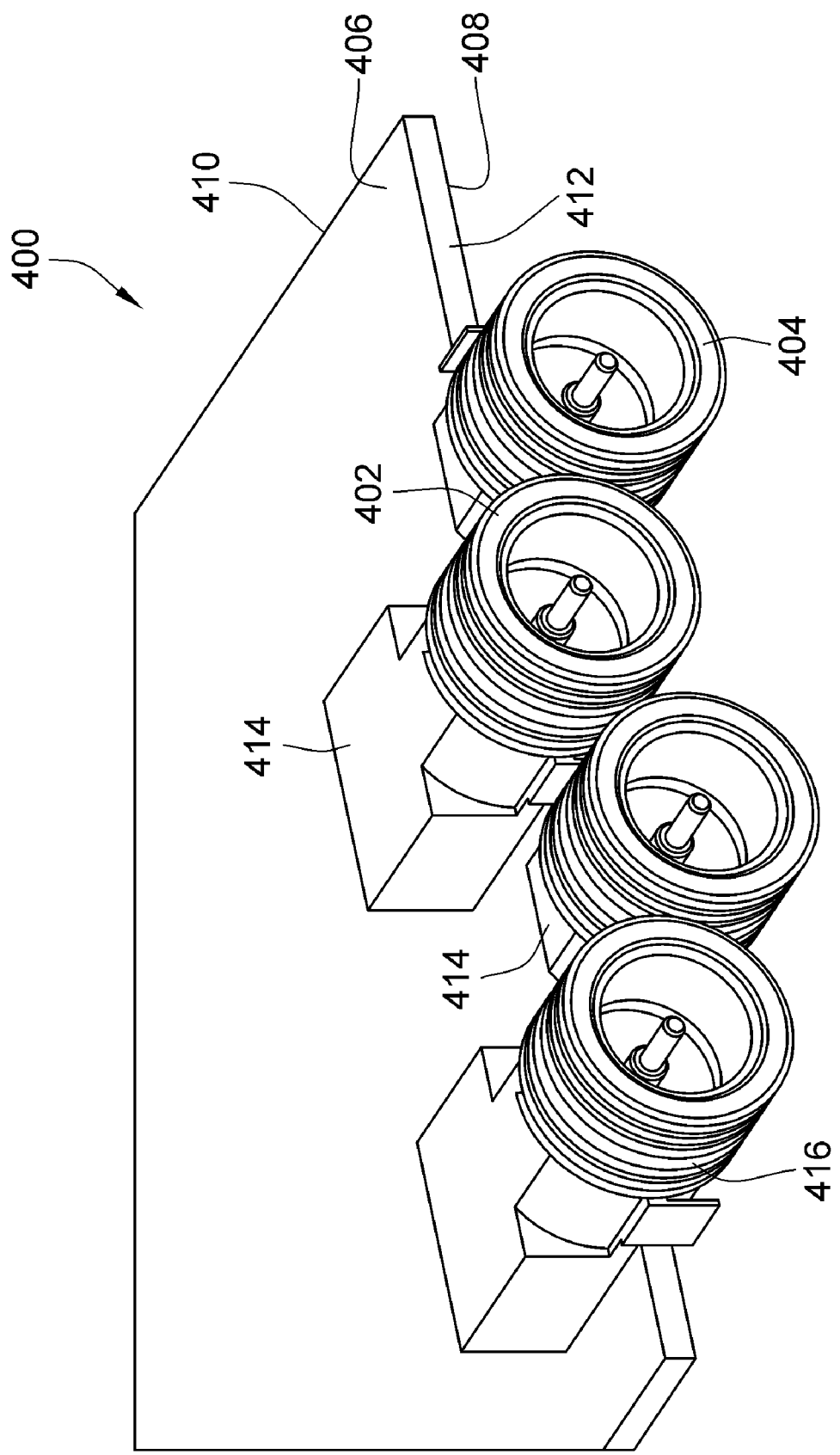
FIG. 4 is a perspective view of a daughter board connector assembly in accordance with another embodiment.

FIG. 4 is a perspective view of a daughter board connector assembly 400 in accordance with another embodiment. The daughter board connector assembly 400 includes connectors 402, 404 mounted to a daughter board 410. Similar to the daughter board connector assembly 102 (shown in FIG. 1), the connectors 402, 404 are mounted to opposite sides 406, 408 of the daughter board 410 along a common board edge 412. The connectors 402, 404 protrude past the board edge 412 to mate with mating connectors such as the connectors 126, 128 (shown in FIG. 1) of the backplane board connector assembly 104 (shown in FIG. 1). The connectors 402, 404 may be similar to the connectors 106, 108 (shown in FIG. 1) of the daughter board connector assembly 102 (shown in FIG. 1). For example, the connectors 402, 404 may be RF or coaxial connectors. In the embodiment shown in FIG. 4, the connectors 402, 404 are compression-type connectors 402, 404 that include a spring element 416. The spring element 416 compresses when the connectors 402, 404 mate with a corresponding mating connector (not shown). Alternatively, the connectors 402, 404 are a different type of connector.

As shown in FIG. 4, each connector 402, 404 is held within a separate housing 414. For example, the housing 414 of each connector 402, 404 is separate from the housing 414 of the neighboring connectors 402, 404 on the same and opposite sides 406, 408 of the daughter board 410. Similar to the housing 208 (shown in FIG. 2), each housing 414 may include or be formed from a dielectric material such as a polymer. The housings 414 may be individually mounted to the daughter board 410.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical connector assembly configured to be mounted to a primary circuit board having opposite first and second sides interconnected by a board edge, the connector assembly comprising:

first and second connectors disposed along the board edge and configured to mate with at least one of mating connectors and a secondary circuit board of an external device to electrically couple the first and second connectors with the external device, each of the first and second connectors having a center signal contact and a shield shell that extends around the center signal contact, the center signal contact of the first connector engaging the first side of the primary circuit board, the center signal contact of the second connector engaging the second side of the primary circuit board, wherein the first and second connectors are configured to mate with the at least one of the mating connectors and the secondary circuit board along parallel mating directions.

2. The connector assembly of claim 1, wherein the first and second connectors are coaxial connectors.

3. The connector assembly of claim 1, wherein a plurality of the first connectors is mounted to the first side of the primary circuit board and separated from one another by a separation gap, further wherein a mating interface of the second connector is vertically aligned with the separation gap.

4. The connector assembly of claim 1, wherein the mating directions are substantially parallel with the first and second sides of the primary circuit board.

5. The connector assembly of claim 1, wherein a center of gravity of the first and second connectors combined is disposed above or within the primary circuit board.

6. The connector assembly of claim 1, wherein the first and second connectors are a single type of connector.

7. The connector assembly of claim 1, wherein the first and second connectors are configured to mate with at least one of a backplane board and the mating connectors mounted to the backplane board of the external device, wherein the primary circuit board and the backplane board are disposed in an approximately perpendicular relationship when the first and second connectors mate with the mating connectors.

8. The connector assembly of claim 1, wherein a plurality of the first connectors is mounted to the first side of the primary circuit board and a plurality of the second connectors is mounted to the second side of the primary circuit board, further wherein each of the plurality of the first connectors and the plurality of the second connectors is linearly aligned with one another in a direction extending substantially parallel to at least one of the first and second sides of the circuit board.

9. The connector assembly of claim 1, wherein a center of gravity of the first connector is proximate to the first side and a center of gravity of the second connector is proximate to the second side, wherein the centers of gravity of the first and second connectors are not aligned along a common axis that extends parallel to the board edge.

10. The connector assembly of claim 1, further comprising a housing that holds the first and second connectors, wherein a center of gravity of the housing, the first connector, and the second connector combined is located between planes that coincide with the first and second sides of the circuit board.

11. The connector assembly of claim 1, wherein a plurality of the first connectors is mounted to the first side of the circuit board and a plurality of the second connectors is mounted to the second side of the circuit board, the first and second connectors alternating along the board edge such that the first and second connectors are arranged in a staggered layout.

12. The connector assembly of claim 1, wherein a plurality of the first connectors is mounted to the first side of the circuit board, adjacent first connectors being separated from each other by an intra-row separation distance and separated from the second connector by an inter-row separation dimension, the inter-row separation dimension being smaller than the intra-row separation distance.

13. An electrical connector assembly configured to be mounted to a circuit board proximate to an edge of the circuit board, the connector assembly comprising:
a first coaxial connector having a center signal contact disposed within a shield shell, the center signal contact of the first coaxial connector mounted to a first side of the circuit board;
a second coaxial connector having a center signal contact disposed within a shield shell, the center signal contact of the second coaxial connector mounted to a second side of the circuit board, wherein the first and second coaxial connectors are configured to mate with mating connectors mounted to an external device along mating directions oriented parallel to the first and second sides of the circuit board.

14. The connector assembly of claim 13, wherein a plurality of the first coaxial connectors is mounted to the first side of the circuit board and separated from one another by a separation gap, further wherein a mating interface of the second coaxial connector is vertically aligned with the separation gap.

15. The connector assembly of claim 13, wherein a plurality of each of the first and second coaxial connectors is mounted to the first and second sides of the circuit board, respectively, further wherein a mating interface of at least one of the first coaxial connectors is vertically aligned with a separation gap between adjacent ones in a pair of the second coaxial connectors and a mating interface of at least one of the second coaxial connectors is vertically aligned with a separation gap between adjacent ones in a pair of the first coaxial connectors.

16. The connector assembly of claim 13, wherein a center of gravity of the first and second coaxial connectors combined is disposed above or within the circuit board.

17. The connector assembly of claim 13, wherein the first and second coaxial connectors are disposed within a unitary housing.

18. The connector assembly of claim 13, wherein the first and second coaxial connectors are disposed within separate housings.

19. The connector assembly of claim 13, wherein the first and second coaxial connectors are configured to mate with at least one of a backplane board and the mating connectors mounted to the backplane board of the external device, wherein the circuit board and the backplane board are disposed in a substantially perpendicular relationship when the first and second coaxial connectors mate with the mating connectors.

20. The connector assembly of claim 13, wherein a plurality of the first coaxial connectors is mounted to the first side of the circuit board and a plurality of the second coaxial connectors is mounted to the second side of the circuit board, further wherein each of the plurality of the first coaxial connectors and the plurality of the second coaxial connectors is linearly aligned with one another in a direction extending substantially parallel to at least one of the first and second sides of the circuit board.

* * * * *